United States Patent
Kruczkowski et al.

(12)

(10) Patent No.: US 6,194,965 B1
(45) Date of Patent: Feb. 27, 2001

(54) DIFFERENTIAL SIGNAL DETECTION CIRCUIT

(75) Inventors: Phil Kruczkowski; Bertrand J. Williams, both of Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/390,591

(22) Filed: Sep. 3, 1999

(51) Int. Cl.[7] ................................................ H03F 3/45
(52) U.S. Cl. ............................................. 330/258; 327/307
(58) Field of Search ................................. 327/124, 307; 330/9, 69, 258

(56) References Cited

U.S. PATENT DOCUMENTS

| 5,663,680 | * | 9/1997 | Nordeng | 330/9 |
| 5,703,516 | * | 12/1997 | Takashima | 327/307 |
| 5,796,301 | * | 8/1998 | Tanabe et al. | 330/9 |
| 5,939,904 | * | 8/1999 | Fetterman et al. | 330/258 X |

OTHER PUBLICATIONS

HOTLINK™ Transmitter/Receiver CY7B923 and CY7B933, Cypress Semiconductor Corporation, Apr. 5, 1999, pp. 1–35.

* cited by examiner

Primary Examiner—Steven J. Mottola
(74) Attorney, Agent, or Firm—Christopher P. Maiorana, P.C.

(57) ABSTRACT

An apparatus comprising a first circuit and a second circuit. The first circuit may be configured to present a first detected data signal in response to (i) one or more first voltages, (ii) one or more second voltages, and (iii) a first reference voltage having a first common mode offset. The second circuit may be configured to present a second detected data signal in response to (i) said one or more first voltages, (ii) said one or more second voltages, and (iii) a second reference voltage having a second common mode offset.

13 Claims, 4 Drawing Sheets

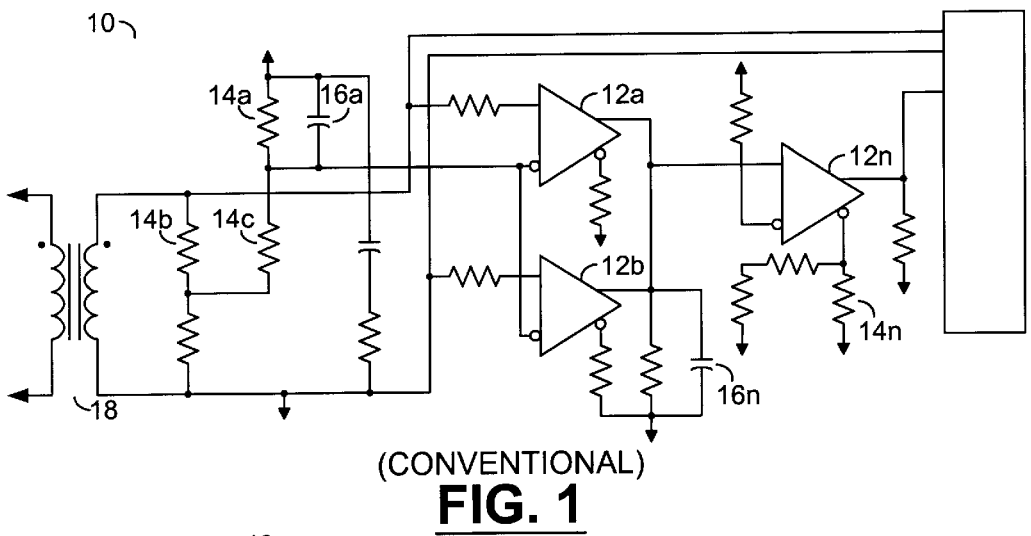
(CONVENTIONAL)
FIG. 1
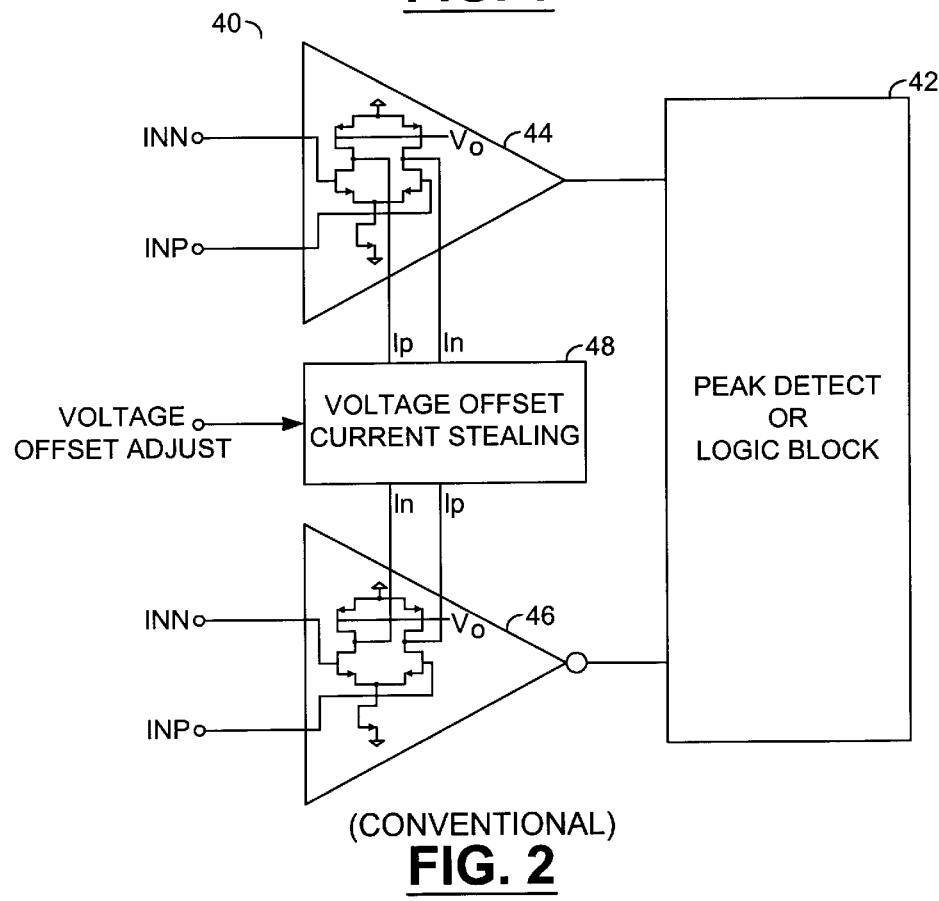
(CONVENTIONAL)
FIG. 2

US 6,194,965 B1

DIFFERENTIAL SIGNAL DETECTION CIRCUIT

FIELD OF THE INVENTION

The present invention relates to a detection circuit generally and, more particularly, to a differential signal detection circuit.

BACKGROUND OF THE INVENTION

Referring to FIG. 1, a circuit 10 illustrates such a conventional approach for implementing a detection circuit. The circuit 10 generally comprises a number of comparators 12a–12n, a number of resistors 14a–14n, a number of capacitors 16a–16n and an inductor 18.

The circuit 10 detects signals primarily through signal peak detection. Input signals are not detected differentially, but compared the positive input transitions with an externally set common mode offset voltage. The capacitor 16n is charged when valid signals are present and discharge through a bleed resistor.

Referring to FIG. 2, a circuit 40 is shown illustrating another conventional detection circuit. The circuit 40 generally comprises a detector logic block 42, a comparator 44, a comparator 46 and a voltage offset current stealing circuit 48. The circuit 40 takes advantage of current stealing to set a trip threshold level. An offset voltage is created between the gates of a differential pair in the stealing circuit. The stealing circuit differential pair is matched to the comparator differential pair, and their drains are connected together. When the voltages at the comparator inputs are equal, the currents through them are unequal by the amount taken by the stealing circuit. A trip point threshold is reached when comparator inputs are unequal by the offset voltage at the stealing circuit. The currents into the comparator differential pair will become equal. As the comparator voltage increases beyond the offset voltage, the output state of the comparator will change.

The circuit 10 uses discrete components which can false trigger with common mode noise. The circuit 40 requires separate differential pairs to create the threshold and comparison circuits. The differential pairs are required to match (or track) each other over process and temperature variations. The currents setting the threshold could be small and difficult to control.

SUMMARY OF THE INVENTION

The present invention concerns an apparatus comprising a first circuit and a second circuit. The first circuit may be configured to present a first detected data signal in response to (i) one or more first voltages, (ii) one or more second voltages, and (iii) a first reference voltage having a first common mode offset. The second circuit may be configured to present a second detected data signal in response to (i) said one or more first voltages, (ii) said one or more second voltages, and (iii) a second reference voltage having a second common mode offset.

The objects, features and advantages of the present invention include providing a differential signal detection circuit that may (i) use a plurality of independent comparators to detect valid serial differential data amplitudes, (ii) dynamically adjust threshold trip points based on input common mode voltage and/or (iii) implement post detection OR functions to detect any phase combination of valid data.

BRIEF DESCRIPTION OF THE DRAWINGS

These and other objects, features and advantages of the present invention will be apparent from the following detailed description and the appended claims and drawings in which:

FIG. 1 is a circuit diagram of a conventional detection circuit;

FIG. 2 is a circuit diagram of a conventional detection circuit;

DETAILED DESCRIPTION OF THE PREFERRED EMBODIMENTS

The present invention may (i) detect high speed differential data transitions and (ii) indicate signal activity after a period of time. The present invention may also indicate signal loss after a predetermined period of time. The present invention may implement, in one example, two sets of differential pairs. Each set may have either a positive or negative common mode offset produced by forcing current through resistors connected between the differential pair bases. Input signals which exceed these offset common mode voltages may be considered valid data. Valid differential data may be essentially peak detected with the differential values summed. A signal detect indication is produced once the sum exceeds a CML voltage level threshold.

In one example, four separate comparators with separate threshold trip points may be dynamically adjusted for common mode variation. A post detection OR may detect valid opposite phase signals. The output may be re-compared against valid CML level voltage thresholds by filtering the inputs of a CML-CMOS level translator producing the detected signal. The threshold trip levels may be user adjustable through an input pin (e.g., to three different levels). The present invention may be implemented to allow factory adjustments to the three levels.

Figure 3:
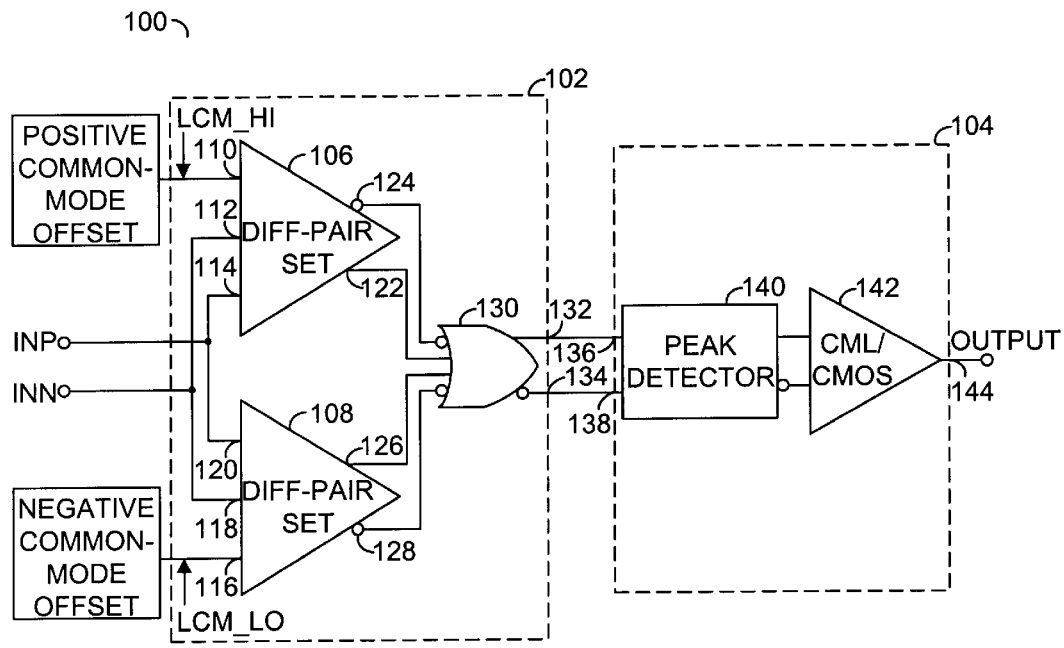
FIG. 3 is a block diagram of a preferred embodiment of the present invention.

Referring to FIG. 3, a block diagram of a circuit 100 is shown in accordance with a preferred embodiment of the present invention. The circuit 100 generally comprises an input section (or circuit) 102 and an output section (or circuit) 104. The input section 102 generally comprises a differential pair set 106 and a differential pair set 108. In one example, the differential pair sets 106 and 108 may each comprise two differential pairs. However, other numbers of differential pairs may be implemented accordingly to meet the design criteria of a particular implementation.

The differential pair set 106 may have an input 110 that may receive a signal (e.g., LCM_HI), an input 112 that may receive a signal (e.g., INN) and an input 114 that may receive a signal (e.g., INP). The differential pair set 108 may have an input 116 that may receive a signal (e.g., LCM_LO), an input 118 that may receive the signal INN and an input 120 that may receive the signal INP. The differential pair set 106 may have an output 122 and an output 124. The differential pair set 108 may have an output 126 and an output 128. The differential pair sets 106 and 108 may present signals to a logic gate 130. The logic gate 130 may present a single ended output 132 and a single ended output 134.

The output section 104 may have an input 136 that may receive the signal from the output 132 and an input 138 that may receive the signal from the output 134. The output section 104 generally comprises a peak detection circuit 140 and a level conversion (or shifter) circuit 142. In one example, the level conversion circuit 142 may be a CML-to-CMOS level shifter. The shifter circuit 142 generally presents a signal (e.g., OUT) and an output 144.

Figure 4:
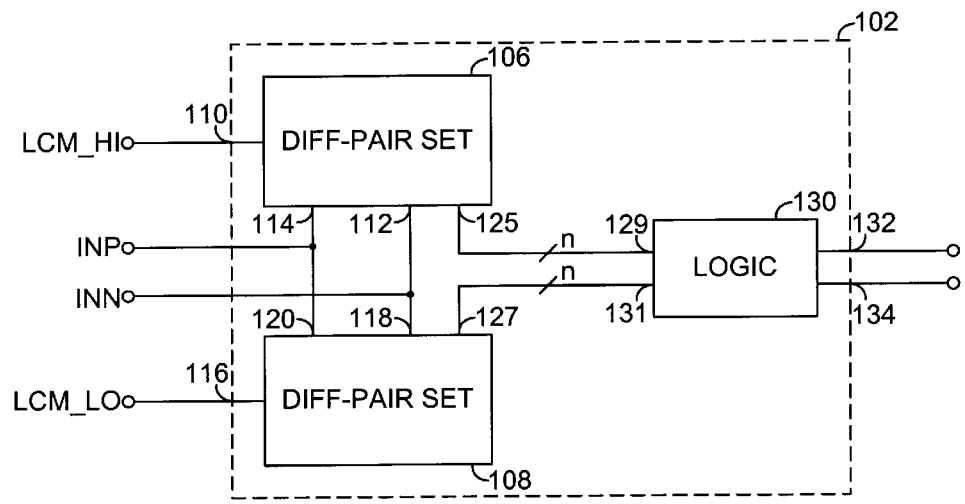
FIG. 4 is a block diagram of an example of the differential pair of FIG. 3.

Referring to FIG. 4, a diagram of the input section 102 is shown. The differential pair set 106 and the differential pair set 108 are shown generically presenting a multi-bit signal at an output 125 and an output 127, respectively. The output 125, may represent the complimentary outputs 122 and 124 illustrated in FIG. 3 or another similar multi-bit output. Similarly, the output 127 may represent the complimentary outputs 126 and 128 illustrated in FIG. 3, or another similar multi-bit output. The logic gate 130 is also shown generically. While FIG. 3 illustrates the logic gate 130 as an OR-gate, other appropriate logic gates may be implemented accordingly to meet the design criteria of a particular implementation. For example, a NOR gate with appropriate inverter circuits may be implemented.

Figure 5:
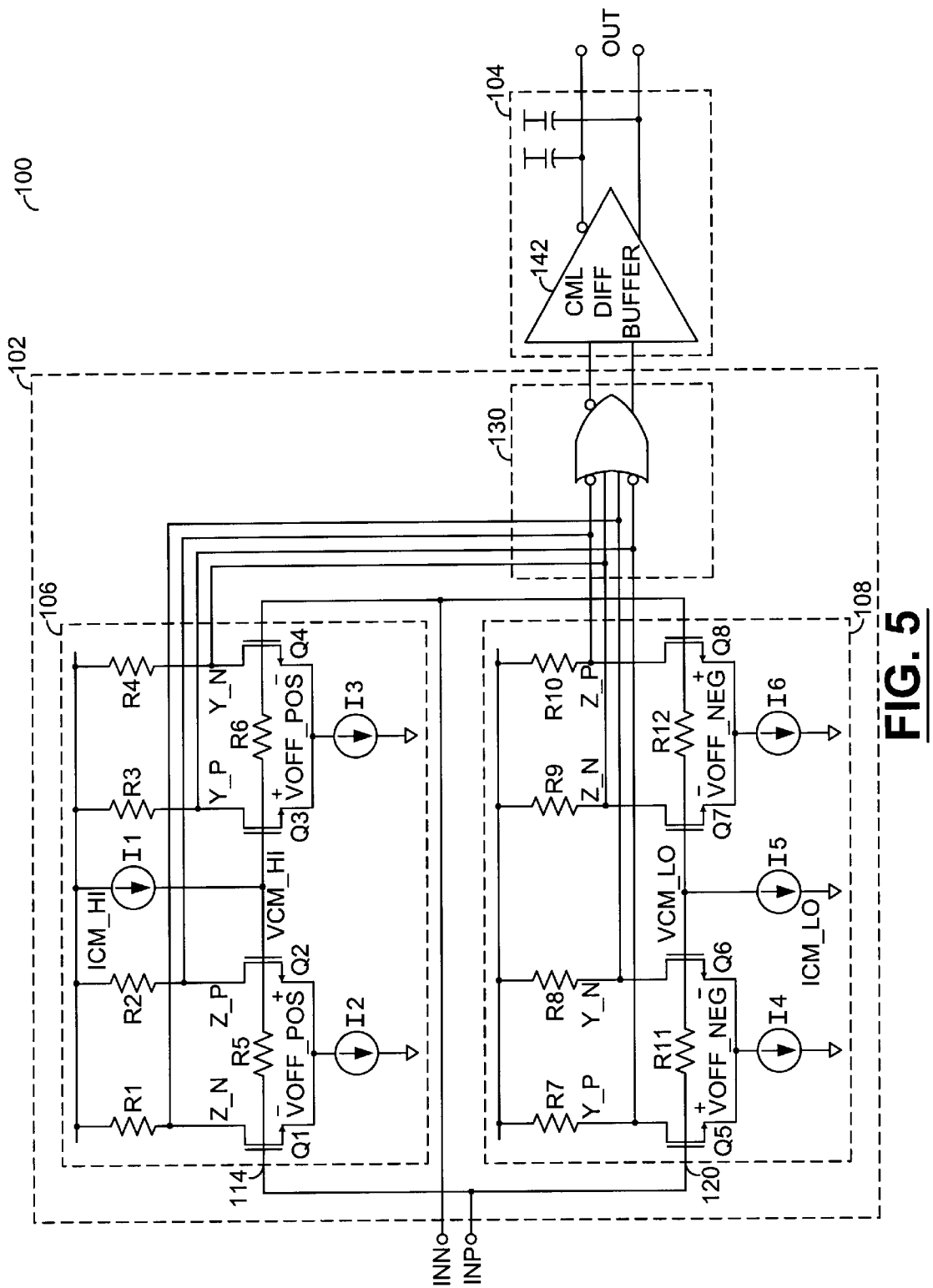
FIG. 5 is a circuit diagram of an example of the differential pair of FIG. 3.

Referring to FIG. 5, a more detailed diagram of the differential pair circuit 102 is shown. The differential pair set circuit 106 generally comprises a transistor Q1, a transistor Q2, a transistor Q3, a transistor Q4, a resistor R1, a resistor R2, a resistor R3, a resistor R4, a resistor R5, a resistor R6, a current source I1, a current source I2 and a current source I3. The transistors Q1 and Q2 generally implement a first differential pair. The transistors Q3 and Q4 generally implement a second differential pair. The gates of the transistors Q1 and Q2 generally create a signal (e.g., VOFF_POS). The gates of the transistors Q3 and Q4 may also receive the signal VOFF_POS. The drains of the transistors Q1, Q2, Q3 and Q4 may be connected to a supply voltage through the resistors R1, R2, R3 and R4. A signal VCM_HI may be connected between the gates of the transistors Q2 and Q3.

The differential pair set 108 may be implemented as a transistor Q5, a transistor QG, a transistor Q7, a transistor Q8, a resistor R7, a resistor R8, a resistor R9, a resistor R10, a resistor R11, a resistor R12, a current source I4, a current source I5 and a current source I6. The transistors Q5 and Q6 generally implement a differential pair. Similarly, the transistors Q7 and Q8 also implement a differential pair. The gates of the transistors Q5 and Q6 generally form a signal VOFF_NEG. The transistors Q7 and Q8 may also receive the signal VOFF_NEG at their gates. A signal VCM_LO may be connected between the gates of the transistors Q6 and Q7. The shifter circuit 142 is shown presenting a differential output signal OUT.

The circuit 100 may provide a robust design that may survive common mode noise. The circuit may employ fully differential signal detection, with four or more independent threshold comparisons. Valid signals are generally detected for any input phase combination. The threshold levels may be adjustable to compensate for a noisy environment. The circuit 100 may create trip threshold offset voltages and input voltage comparisons within the same differential block.

The resistor R5, R6, R11 and R12 may set up threshold levels VCM_LO/VCM_HI at the common mode points. Forcing current into the common mode node generally raises the effective common mode voltage by I*R. Removing current reduces the other effective common mode node voltage by I*R. The transistors Q2 and Q3 are nominally on until either input rises above the common mode voltage. The transistors Q6 and Q7 are nominally off until one of the inputs drops below the common mode voltage VCM_LO.

The outputs, in one example, are "wired-or'd" together to from two sets of CML differential voltage level signals. These levels are then used in standard CML logic blocks to create the detected signal OUT. Four separate comparators with separate threshold trip points that dynamically adjust for common mode variation. Post detection ORing may be implemented to detect valid opposite phase signals. Re-comparison against valid CML level voltage thresholds may provide filtering of the inputs of a CML-CMOS level translator to generate the signal OUT.

Figure 6:
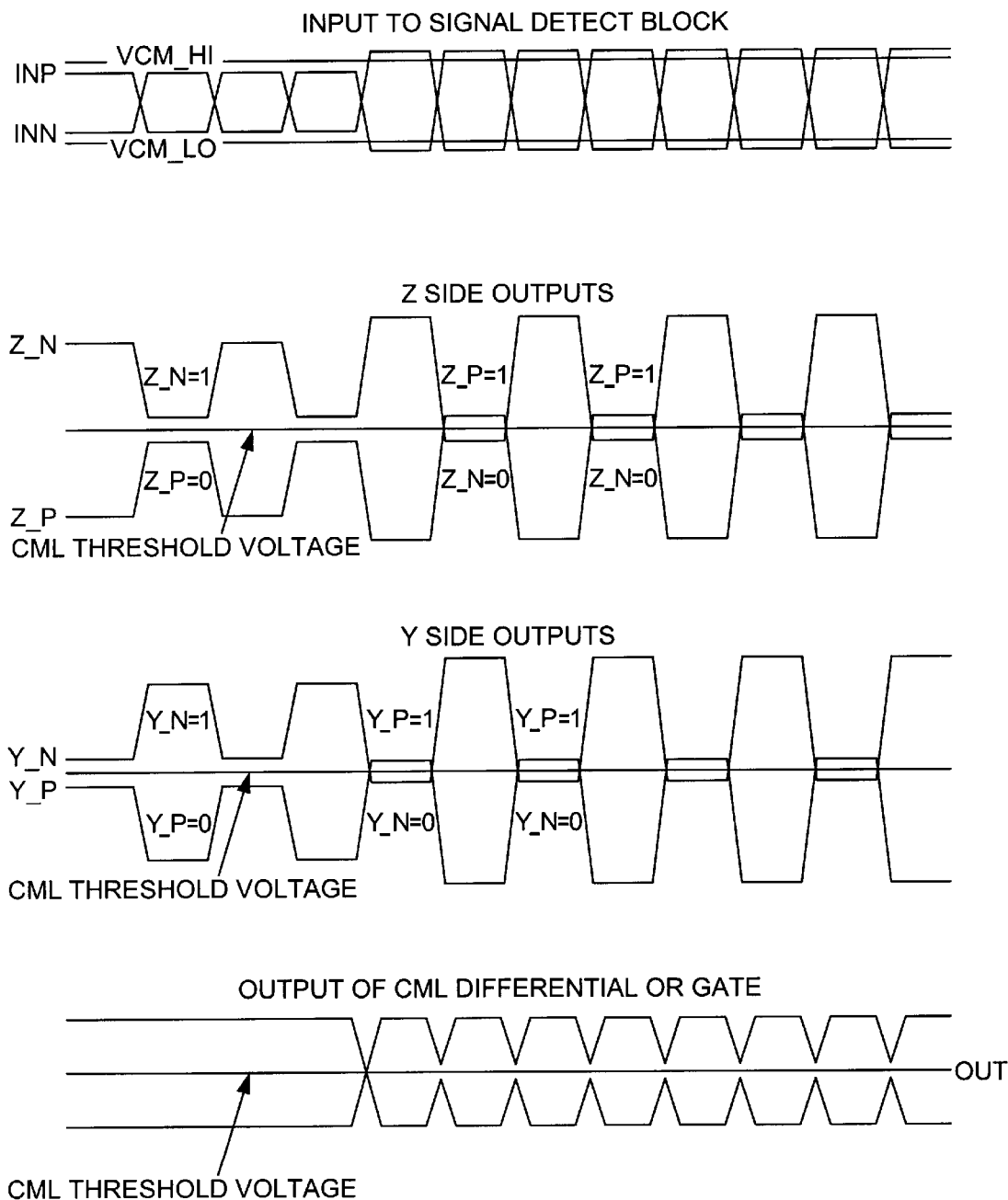
FIG. 6 is a timing diagram showing the various waveforms of the present invention.

Referring to FIG. 6, a timing diagram of the various outputs of the present invention is shown. One waveform illustrates the signals INP and INN compared to the signals VCM_HI and VCM_LO. Another waveform illustrates the signals Z_N and Z_P when compared to a CML threshold voltage. Another waveform illustrates the signals Y_N and Y_P compared to a CML threshold voltage. Another waveform illustrates the signal OUT.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit configured to present a first detected data signal in response to (i) one or more first voltages, (ii) one or more second voltages, and (iii) a first reference voltage having a first common mode offset;
   a second circuit configured to present a second detected data signal in response to (i) said one or more first voltages, (ii) said one or more second voltages, and (iii) a second reference voltage having a second common mode offset; and
   one or more resistors implemented between one or more differential pairs and one or more current sources, said resistors configured to set a voltage threshold trip level to either said first circuit or said second.

2. The apparatus according to claim 1, wherein a first one or more of said resistors present a first voltage threshold trip level to said first circuit and a second one or more of said resistors present a second voltage threshold trip level to said second circuit.

3. The apparatus according to claim 1, further configured to detect valid data on any phase combination of said one or more first voltages and said one or more second voltages.

4. The apparatus according to claim 1, wherein said one or more differential pairs are implemented using MOSFET devices or Bipolar devices.

5. The apparatus according to claim 1, wherein said one or more resistors are implemented using MOSFET devices or Bipolar devices.

6. The apparatus according to claim 1, wherein said first and second circuits comprise voltage comparators configured to detect a serial differential data signal by comparing to a dynamically adjusted threshold limit.

7. The apparatus according to claim 6, wherein said dynamically adjusted threshold limit is generated in response to common mode voltage of said serial differential data stream.

8. A circuit comprising:
   means for generating a first detected data signal in response to (i) one or more first voltages, (ii) one or more second voltages, and (iii) a first reference voltage having a first common mode offset;
   means for generating a second detected data signal in response to (i) said one or more first voltages, (ii) said one or more second voltages, and (iii) a second reference voltage having a second common mode offset; and one or more resistors implemented between one or more differential pairs and one or more current sources, said resistors configured to set a voltage threshold trip level to either said means for generating said first detected data signal or said means for generating said second detected data signal.

9. A method for differentially detecting a signal comprising the steps of:

(A) generating a first detected data signal by comparing (i) one or more first voltages, (ii) one or more second voltages, and (iii) a first reference voltage having a first common mode offset; and (B) generating a second detected data signal by comparing (i) said one or more first voltages, (ii) said one or more second voltages, and (iii) a second reference voltage having a second common mode offset; and (C) generating a resistance to set a voltage threshold trip level presented to steps (A) or (B).

10. The method according to claim 9, wherein step (C) further comprising the sub-steps of:

(C-1) generating a first resistance to set a first voltage threshold trip level presented to step (A); and (C-2) generating a second resistance to set a second voltage threshold trip level presented to step B.

11. The method according to claim 10 wherein said resistance is generated with active MOSFET devices or Bipolar devices.

12. A method according to claim 11 wherein steps (A) and (B) detects valid serial differential data determined by a comparison to a dynamically adjusted threshold limit.

13. The method according to claim 12, wherein said dynamically adjusted threshold limit is generated in response to common mode voltage of a serial differential data stream.

* * * * *